United States Patent
McKittrick et al.

(10) Patent No.: US 11,822,393 B2
(45) Date of Patent: Nov. 21, 2023

(54) THERMAL WINDOW FOR INFORMATION HANDLING SYSTEM (IHS) HOUSING

(71) Applicant: Dell Products, L.P., Round Rock, TX (US)

(72) Inventors: Allen B. McKittrick, Cedar Park, TX (US); Pomin Shih, Taipei (TW); Jeffrey D. Kane, Austin, TX (US)

(73) Assignee: Dell Products L.P., Round Rock, TX (US)

(*) Notice: Subject to any disclaimer, the term of this patent is extended or adjusted under 35 U.S.C. 154(b) by 44 days.

(21) Appl. No.: 17/653,736

(22) Filed: Mar. 7, 2022

(65) Prior Publication Data
US 2023/0280792 A1    Sep. 7, 2023

(51) Int. Cl.
G06F 1/16    (2006.01)
H05K 7/20    (2006.01)

(52) U.S. Cl.
CPC ......... *G06F 1/1656* (2013.01); *H05K 7/2039* (2013.01); *H05K 7/20136* (2013.01)

(58) Field of Classification Search
CPC ............. H05K 7/2039; H05K 7/20136; H05K 7/20436; G06F 1/1656; G06F 1/203; G06F 1/206
See application file for complete search history.

(56) References Cited

U.S. PATENT DOCUMENTS

| | | | | |
|---|---|---|---|---|
| 5,925,847 A * | 7/1999 | Rademacher | ........ | H05K 9/0045 455/90.3 |
| 7,352,584 B1 * | 4/2008 | Sung | ........ | C23C 30/00 361/708 |
| 7,486,517 B2 * | 2/2009 | Aapro | ........ | H05K 7/20436 361/705 |
| 7,817,418 B2 * | 10/2010 | Bailey | ........ | H05K 5/0234 361/679.59 |
| 8,345,411 B2 * | 1/2013 | Tseng | ........ | H05K 5/0234 361/679.02 |
| 9,615,011 B1 * | 4/2017 | Fleming | ........ | H04N 23/698 |
| 10,886,821 B2 * | 1/2021 | Larson | ........ | G08B 6/00 |
| 11,388,276 B2 * | 7/2022 | Huh | ........ | H04N 23/57 |
| 11,586,261 B2 * | 2/2023 | Choi | ........ | G06F 1/1656 |
| 11,592,883 B2 * | 2/2023 | Shih | ........ | G06F 1/1662 |
| 2008/0151503 A1 * | 6/2008 | Aapro | ........ | H04M 1/026 361/714 |
| 2009/0231805 A1 * | 9/2009 | Schlesener | ........ | B29C 45/1676 428/53 |
| 2010/0091441 A1 * | 4/2010 | Bailey | ........ | H05K 5/0234 361/679.01 |
| 2011/0286172 A1 * | 11/2011 | Tseng | ........ | G06F 1/181 248/346.03 |
| 2015/0305458 A1 * | 10/2015 | Chang | ........ | H04M 1/185 224/191 |
| 2023/0031055 A1 * | 2/2023 | Shih | ........ | G06F 1/1662 |

* cited by examiner

*Primary Examiner* — Adrian S Wilson
(74) *Attorney, Agent, or Firm* — Fogarty LLP (57) ABSTRACT

Embodiments of systems and methods for providing a thermal window for an Information Handling System (IHS) housing are described. In some embodiments, an IHS may include a plurality of components and a housing configured to hold the plurality of components, where the housing includes a plate having a metal portion and a plastic portion, and where the plastic portion is positioned adjacent a hot spot of the IHS.

18 Claims, 6 Drawing Sheets

THERMAL WINDOW FOR INFORMATION HANDLING SYSTEM (IHS) HOUSING

FIELD

This disclosure relates generally to Information Handling Systems (IHSs), and more specifically, to systems and methods for providing a thermal window for an IHS housing.

BACKGROUND

As the value and use of information continues to increase, individuals and businesses seek additional ways to process and store it. One option available to users is an Information Handling System (IHS). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated.

Variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Portable IHSs may include laptops, tablets, smartphones, convertible devices (an IHS having separate portions coupled to each other via a hinge), etc. As the inventors hereof have recognized, a problem associated with portable IHSs is that heat dissipated by certain IHS components can increase the IHS housing's surface temperature to a point where it becomes uncomfortable or dangerous to touch.

SUMMARY

Embodiments of systems and methods for providing a thermal window for an Information Handling Systems (IHS) housing are described. In an illustrative, non-limiting embodiment, an IHS may include a plurality of components and a housing configured to hold the plurality of components, where the housing includes a plate having a metal portion and a plastic portion, and where the plastic portion is positioned adjacent a hot spot of the IHS.

In some implementations, the housing may have a tablet, smartphone, or laptop form factor. The plastic portion may be at least partially co-extensive with the hot spot. In this case, the shape of the plastic portion may follow a shape of the hot spot. Additionally, or alternatively, the plastic portion may be at least partially co-extensive with a heat pipe or heat sink of the IHS. In that case, a shape of the plastic portion may follow a shape of the heat pipe or heat sink.

The plastic portion may be located between two fans of the IHS. The metal portion may include at least one of: magnesium, or aluminum. The plastic portion may include a resin or polymer blend. The plastic portion may be over molded onto the metal portion. The plate may include a second plastic portion separated from the plastic portion by the metal portion. The plastic portion and the second plastic portion may be part of a honeycomb structure.

In another illustrative, non-limiting embodiment, a backplate of a housing may include a first portion comprising a first material having a first thermal conductivity, and a second portion coupled to the first portion, where the second portion includes a second material having a second thermal conductivity lower than the first thermal conductivity, and where the second portion is positioned next to a heat source of an IHS configured to operate in the housing. The first material may include at least one of: magnesium, or aluminum, and the second material may include a resin or polymer blend. The backplate may include a third portion comprising a third material having a third thermal conductivity lower than the second thermal conductivity. The second portion may be at least partially co-extensive with a perimeter of the heat source.

In another illustrative, non-limiting embodiment, a method may include creating a thermal window on a plate of a housing configured to house an IHS, where the thermal window corresponds to a processor area of the IHS, and integrating a material into the thermal window, where a thermal insulation of the material is greater than a thermal insulation of the plate. In some cases, creating the thermal window may include removing a portion of the plate and integrating the material may include injecting the material in the thermal window. Additionally, or alternatively, creating the thermal window may include stamping a portion of the plate and integrating the material may include coating the stamped portion with the material. Moreover, the thermal window may be configured to equalize a temperature of the housing across the plate during operation of the IHS.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

For purposes of this disclosure, an Information Handling System (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An example of an IHS is described in more detail below. It should be appreciated that although certain embodiments are discussed in the context of a personal computing device, other embodiments may utilize various other types of IHSs.

Figure 1:
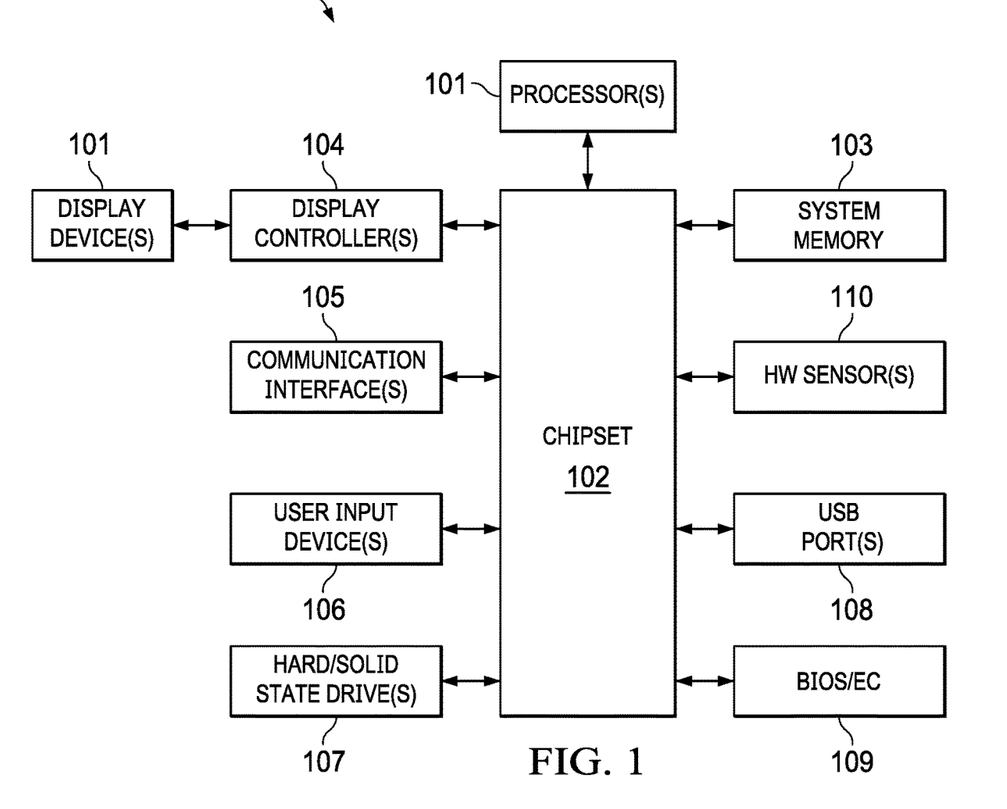
FIG. 1 is a diagram of an example of an Information Handling System (IHS), according to some embodiments.

FIG. 1 is a block diagram of components of IHS 100, according to some embodiments. As depicted, IHS 100 includes processor(s) 101. In various embodiments, IHS 100 may be a single-processor system, or a multi-processor system including two or more processors. Processor(s) 101 may include any processor capable of executing program instructions, such as a PENTIUM series processor, or any general-purpose or embedded processors implementing any of a variety of Instruction Set Architectures (ISAs), such as an x86 ISA or a Reduced Instruction Set Computer (RISC) ISA (e.g., POWERPC, ARM, SPARC, MIPS, etc.).

IHS 100 includes chipset 102 coupled to processor(s) 101. Chipset 102 (e.g., a Platform Controller Hub or "PCH," a Fusion Controller Hub or "FCH," etc.) may provide processor(s) 101 with access to several resources. In some cases, chipset 102 may utilize a QuickPath Interconnect (QPI) bus to communicate with processor(s) 101. Chipset 102 may also be coupled to communication interface(s) 105 to enable communications between IHS 100 and various wired and/or wireless networks, such as Ethernet, WiFi, BLUETOOTH, cellular or mobile networks (e.g., Code-division multiple access or "CDMA," Time-division multiple access or "TDMA," Long-Term Evolution or "LTE," 5G, etc.), satellite networks, or the like. In some cases, communication interface(s) 105 may be coupled to chipset 102 via a PCIe bus.

Chipset 102 may be coupled to display controller(s) 104, which may include one or more or Graphics Processor Unit(s) (GPUs) on a graphics bus, such as an Accelerated Graphics Port (AGP) or Peripheral Component Interconnect Express (PCIe) bus. As shown, display controller(s) 104 provide video or display signals to display device(s) 111. In some cases, display controller(s) 104 may also include a touchscreen controller that enables a user to provide touch inputs (e.g., finger, pen, etc.) directly on the surface of display device(s) 111. In other implementations, any number of display controller(s) 104 or display device(s) 111 may be used.

Display device(s) 111 may include Liquid Crystal Display (LCD), Light Emitting Diode (LED), organic LED (OLED), or other thin film display technologies. Display device(s) 111 may include a plurality of pixels arranged in a matrix, configured to display visual information, such as text, two-dimensional images, video, three-dimensional images, etc. In some cases, display device(s) 111 may be provided as a single continuous display, or as two or more discrete displays.

Chipset 102 may provide processor(s) 101 and/or display controller(s) 104 with access to system memory 103. In various embodiments, system memory 103 may be implemented using any suitable technology, such as static RAM (SRAM), dynamic RAM (DRAM) or magnetic disks, or any nonvolatile/Flash-type memory, such as a solid-state drive (SSD) or the like.

Chipset 102 may also provide access to one or more hard disk and/or solid-state drive(s) 107. In certain embodiments, chipset 102 may also provide access to one or more optical drives or other removable-media drives. In certain embodiments, chipset 102 may further provide access to one or more Universal Serial Bus (USB) port(s) 108.

Chipset 102 may be coupled to one or more user input device(s) 106, for example, via a super I/O controller or the like. Examples of user input device(s) 106 include, but are not limited to, a keyboard, mouse, touchpad, stylus or pen, totem, etc. Each of user input device(s) 106 may include a respective controller (e.g., a touchpad may have its own touchpad controller) that interfaces with chipset 102 through a wired or wireless connection (e.g., via communication interface(s) 105).

In certain embodiments, chipset 102 may also provide an interface for communications with one or more hardware sensor(s) 110. Sensor(s) 110 may be disposed on or within the housing of IHS 100, and may include, but are not limited to: electric, magnetic, Hall, radio, optical, photo, infrared, thermal, force, pressure, acoustic, ultrasonic, proximity, position, deformation, bending, direction, movement, velocity, rotation, and/or acceleration sensor(s).

Upon booting of IHS 100, processor(s) 101 may utilize Basic Input/Output System (BIOS) instructions of BIOS/Embedded Controller (EC) 109 to initialize and test hardware components coupled to IHS 100 and to load an OS for use by IHS 100. The BIOS provides an abstraction layer that allows the OS to interface with certain hardware components that are utilized by IHS 100. Via the hardware abstraction layer provided by the BIOS, software stored in system memory 103 and executed by processor(s) 101 can interface with certain I/O devices that are coupled to IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

EC 109 may be installed as a Trusted Execution Environment (TEE) component to the motherboard of IHS 100. EC 109 may implement operations for interfacing with a power adapter in managing power for IHS 100. Such operations may be utilized to determine the power status of IHS 100, such as whether IHS 100 is operating from battery power or is plugged into an AC power source. Firmware instructions utilized by EC 109 may be used to provide various core operations of IHS 100, such as power management and management of certain modes of IHS 100 (e.g., turbo modes, maximum operating clock frequencies of certain components, etc.).

EC 109 may also implement operations for detecting certain changes to the physical configuration or posture of IHS 100. For instance, where IHS 100 as a 2-in-1 laptop/tablet form factor, EC 109 may receive inputs from a lid position or hinge angle sensor (e.g., sensor(s) 110), and it may use those inputs to determine: whether the two sides of IHS 100 have been latched together to a closed position or a tablet position, the magnitude of a hinge or lid angle, etc.

In other embodiments, IHS 100 may not include all the components shown in FIG. 1. In other embodiments, IHS 100 may include other components in addition to those that are shown in FIG. 1. Furthermore, some components that are represented as separate components in FIG. 1 may instead be integrated with other components. For example, all or a portion of the operations executed by the illustrated components may instead be provided by components integrated into processor(s) 101 as a System-On-a-Chip (SoC). In certain embodiments, IHS 100 may be implemented as different types of portable IHSs including, but not limited to: laptops, tablets, smartphones, convertible devices (e.g., dual display IHSs), video game consoles, etc.

Figure 2:
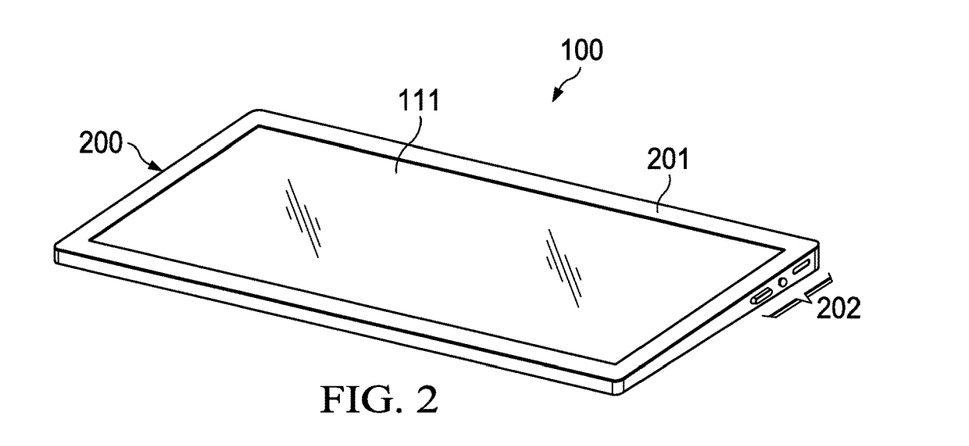
FIG. 2 is a diagram of an example of a portable IHS, according to some embodiments.

FIG. 2 is a diagram of an example of portable housing 200 for IHS 100 (e.g., a tablet device). The bottom surface of housing 200 rests on a planar surface, such as a tabletop, to provide a user with touchscreen display 111 with which to interact. In this example, housing 200 includes one or more openings 202 for power buttons, volume controls, audio/video jacks or ports, a charging port, etc. Portable housing 200 also includes bezel, edge, frame, or border 201 around at least a portion of its perimeter.

As the demand for portable IHSs grows, the need for thin IHS housings increases. To meet weight-to-strength ratio requirements, a thin IHS housing is typically made of metal or metallic alloy or material (e.g., magnesium, aluminum, etc.). Because of its high thermal conductivity properties, however, having a housing made entirely of metal can reduce the performance of an IHS insofar as it limits the maximum operating temperatures of certain components (e.g., processor(s) 101) disposed therein. In some cases, an IHS component may be throttled down specifically to ensure that the IHS operate with its housing below a maximum surface temperature.

Figure 3:
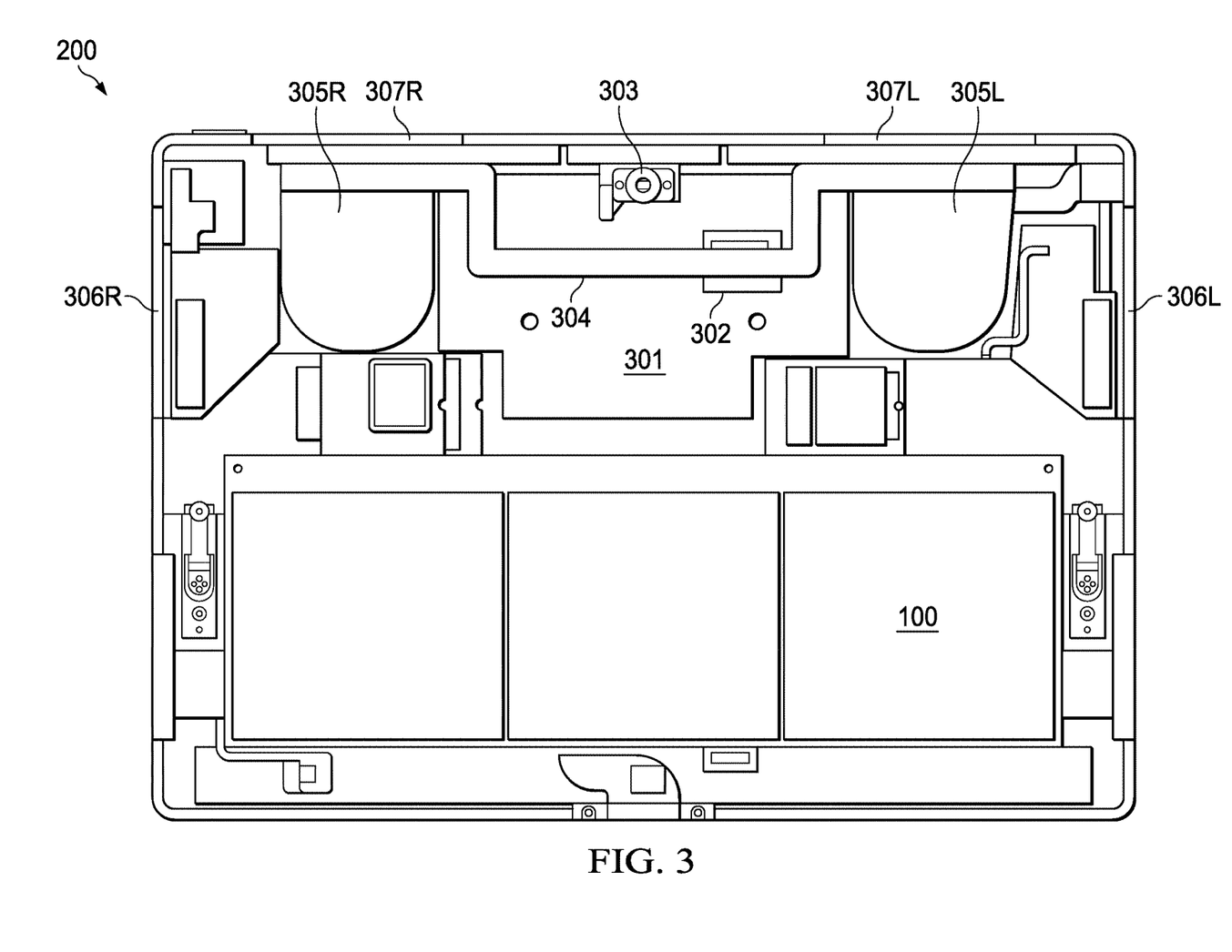
FIG. 3 is an example of components of an IHS in a housing, according to some embodiments.

FIG. 3 is an example of components of IHS 100 in housing 200. In this implementation, IHS 100 includes a plurality of components, such as Integrated Circuit (IC) 302 (e.g., processor(s) 101) mounted on motherboard 301, camera 303 mounted on housing 200, etc. IC 302 may be a high-temperature component coupled to heat pipe or heat sink 304, which in turn may be coupled to the heat exchanging elements of fans 305R and 305L symmetrically located around center region 301. Lateral vents 306R and 306L may receive cool air into housing 200 and front vents 307R and 307L may output hot air from housing 200.

Figure 4:
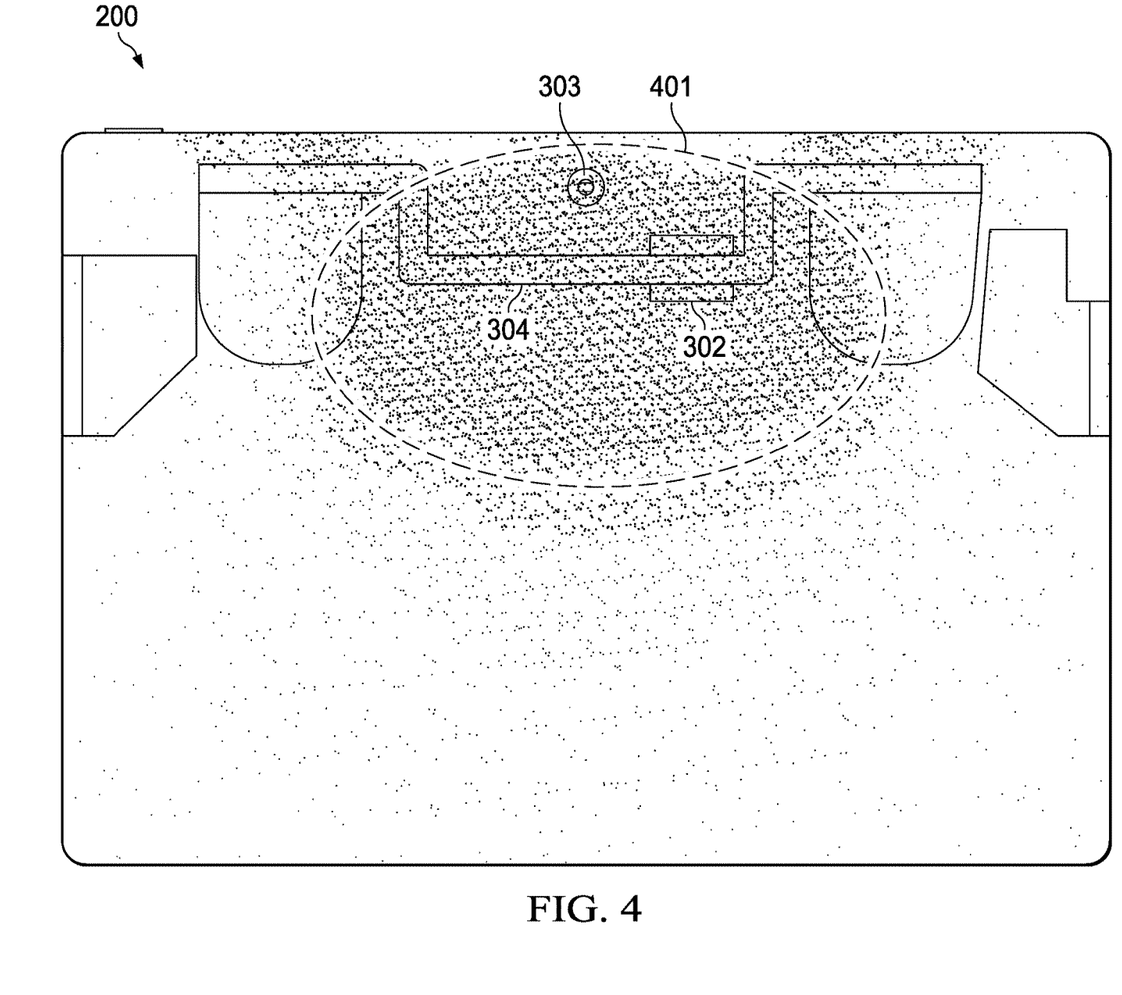
FIG. 4 is an example of a heat map of an IHS in a housing, according to some embodiments.

FIG. 4 provides an example of a heat map of IHS 100. In this case, when IHS 100 is in operation, local host spot 401 is produced with temperatures that are higher (more shading) than surrounding areas of housing 200 (less shading).

In various embodiments, systems and methods described herein may provide a co-molded thermal insulator placed in selected regions of housing 200. Using processes such as die casting, injection molding, etc., housing 200 may be manufactured with a plastic region over molded in one or more locations corresponding to one or more hot spots, heat sources, and/or high-temperature components of IHS 100 (e.g., 302, 303, 304, etc.). For example, in some cases a metal or metallic portion of housing 200 may provide structure and support to IHS 100 while a plastic portion may provide thermal insulation to the one or more hot spots, heat sources, and/or high-temperature components—thus lowering the housing's skin temperatures, reducing noise (from fans 305R and 305L), and enabling an increase in overall IHS performance.

Figure 5:
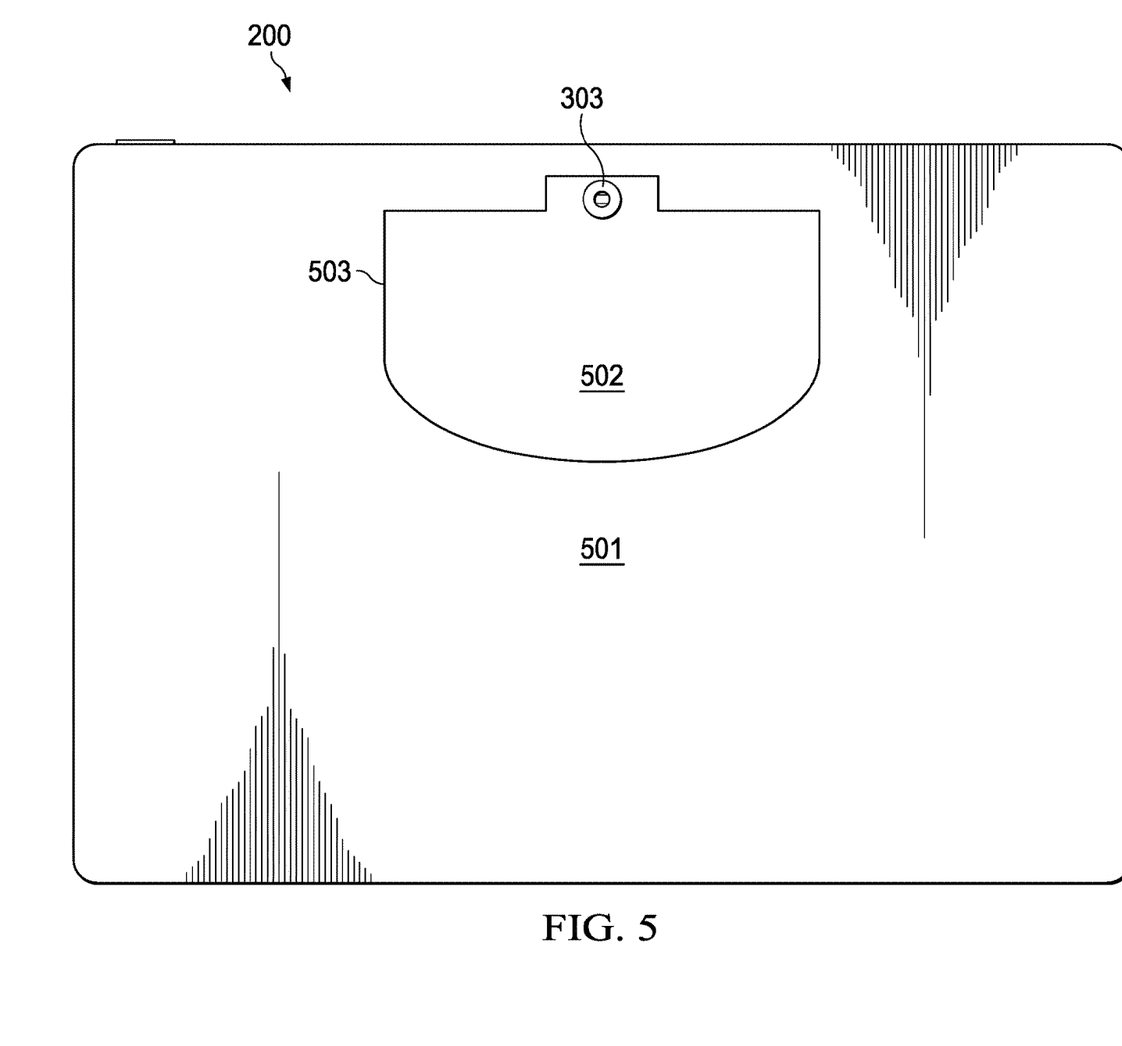
FIG. 5 is a diagram of an example of a thermal window, according to some embodiments.

FIG. 5 is a diagram of an example of thermal window 502 manufactured on backplate 501 of housing 200, opposite display 111. In this example, thermal window 502 may have a shape or outline 503 surrounding hot spot 401, camera 303, and/or heat pipe or heat sink 304.

In various implementations, thermal window 502 may be at least partially co-extensive with hot spot 401 when IHS 100 disposed within housing 200 is operating. Additionally, or alternatively, outline 503 may follow a shape or contour of hot spot 401. Additionally, or alternatively, thermal window 502 may be at least partially co-extensive with heat pipe or heat sink 304. Additionally, or alternatively, outline 503 may follow a shape or contour of heat pipe or heat sink 304. Additionally, or alternatively, thermal window 502 may be at least partially co-extensive with component 302. Additionally, or alternatively, outline 503 may follow a shape or contour of component 302. Additionally, or alternatively, thermal window 502 may be located between two fans 305R and 305L.

In various embodiments, backplate 501 may be made of a metal or metallic alloy or material, similar to the rest of housing 200. Conversely, thermal window 502 may be a plastic material or compound, resin, or polymer blend, such as, for example: Acrylonitrile Butadiene Styrene (ABS), High-density Polyethylene (HDPE), Polyether Ether Ketone (PEEK), polyamide (Nylon), polycarbonate (PC), polyethylene (PE), polyetherimide (PEI), polybutylene terephthalate (PBTR), polyoxymethylene (POM), polypropylene (PP), polypropiolactone (PPL), polyvinyl chloride (PVC), thermoplastics, etc. Alternatively, thermal window 502 may be made of acrylic, silicone, glass, ceramic, etc.

As a result, backplate 501 may have a first thermal conductivity and thermal window 502 may have a second thermal conductivity, such that the first thermal conductivity is greater than the second thermal conductivity. Additionally, or alternatively, backplate 501 may provide a first thermal insulation and thermal window 502 may provide a second thermal insulation, such that the second thermal insulation is greater than the first thermal insulation.

The different conductivity or insulating properties of the different regions of housing 200 (i.e., backplate 501 and one or more thermal windows 502) may be selected to equalize the temperature distribution across an entire surface of housing 200. To distribute the temperature evenly, the selection of materials for the different regions of housing 200 may account for the location, size, contour, and/or temperature of hot spot 401, heat source 304, or high-temperature component 302 of IHS 100.

Although one thermal window 502 is shown in FIG. 5, it should be noted that in implementations where there are multiple hot spots, heat sources, or high-temperature components, multiple thermal windows may be over molded onto backplate 501. Each of a plurality of thermal windows may be disposed at locations of backplate 501 corresponding to a respective hot spot, heat source, or high-temperature component of IHS 100.

Figure 6:
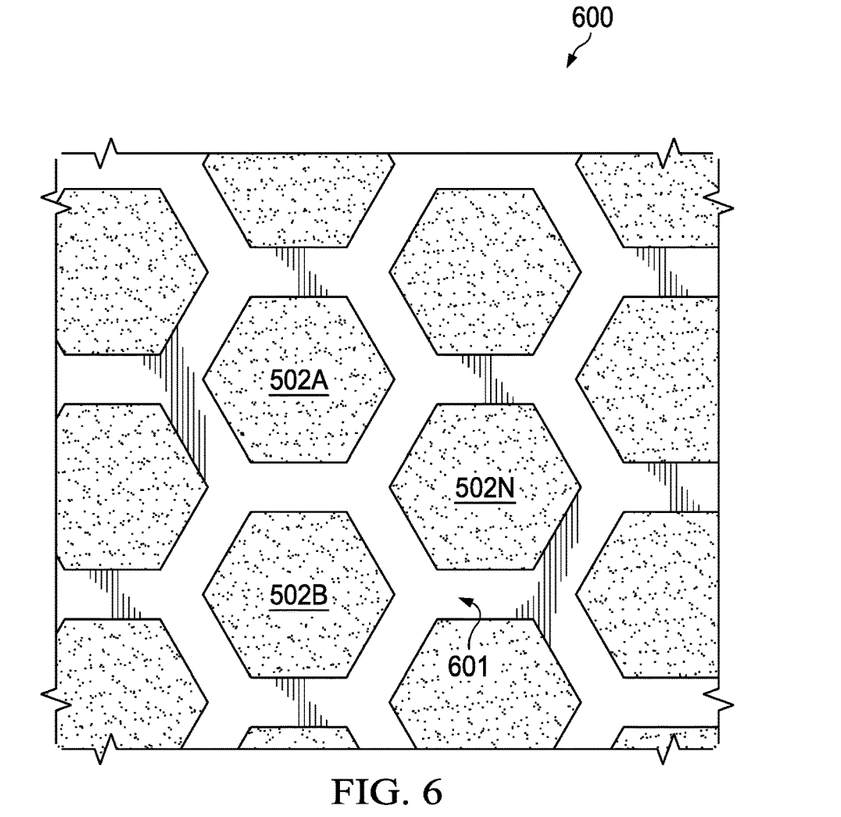
FIG. 6 is a diagram of an example of a backplate with a plurality of thermal windows, according to some embodiments.

FIG. 6 is a diagram of an example of backplate portion 600 with a plurality of thermal windows 502A-N. In some cases, backplate portion 600 may span an entirety of backplate 501. In other cases, backplate portion 600 may span a smaller area (e.g., thermal window 502 in FIG. 5). In this example, thermal windows 502A-N are interspersed by honeycomb structure 601, which may be made of the same metallic material as, and/or be a part of, backplate 501. In other implementations, however, the geometric shape, size, number, uniformity, and/or distribution of thermal windows 502A-N in honeycomb structure 601 may be different.

Figure 7:
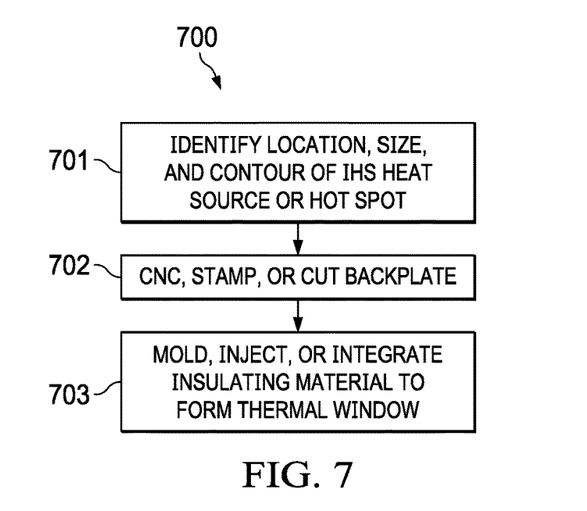
FIG. 7 is a flowchart of an example of a method for providing a thermal window, according to some embodiments.

FIG. 7 is a flowchart of an example of method 700 for providing a thermal window (e.g., thermal windows 502 or 502A-N) in an IHS housing. At 701, method 700 includes identifying a location, size, and contour of a hot spot, heat source, or high-temperature component of IHS 100 within its housing. At 702, method 700 includes manufacturing a thermal window on a selected region of a metal backplate of the IHS's housing, for example, using a Computer Numerical Control (CNC), stamping, or laser cutting process. The location, size, and contour of the thermal window on the housing may match the location, size, and contour of the hot spot, heat source, or high-temperature component of IHS 100. Then, at 703, method 700 may over mold, co-mold, inject, adhere, or otherwise integrate a less thermally conductive (or more insulating) material—e.g., plastic, etc.—into the thermal window.

Figure 8:
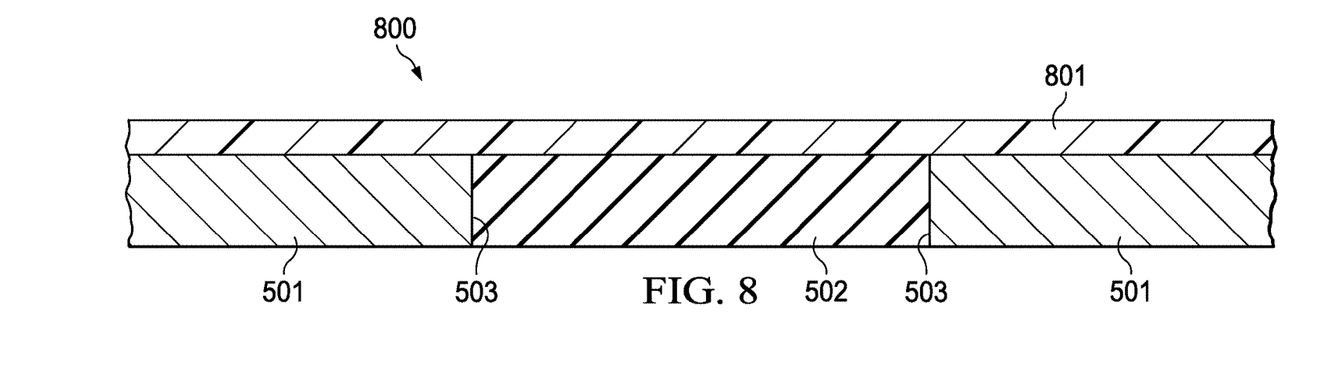
FIGS. 8 and 9 are cross section views of examples of thermal window structures, according to some embodiments.
Figure 9:
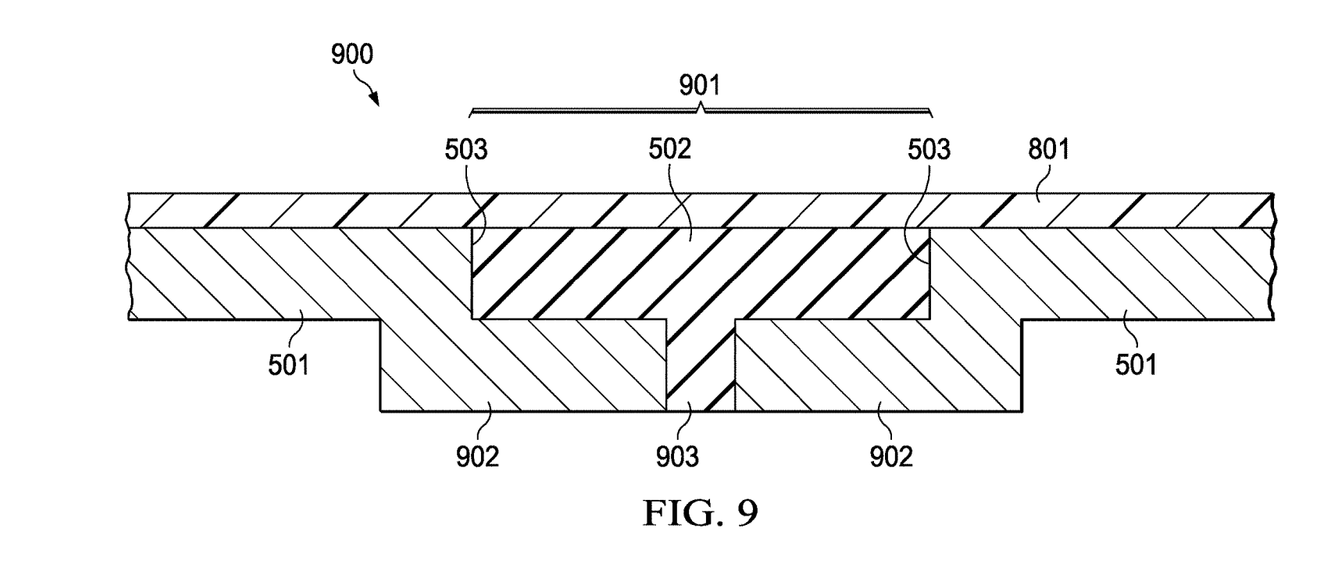

FIGS. 8 and 9 are cross section views of examples of thermal window structures 800 and 900, respectively. In thermal window structure 800, backplate 501 surrounds thermal window 502 having contour or shape 503. Thermal window 502 may be manufactured on backplate 501 by laser cutting, for example. Also, backplate 501 and thermal window 502 may have the same thickness. Paint, coat, or finish layer 801 may overlay backplate 501 and thermal window 502 to provide a seamless visual appearance.

In thermal window structure 900, contour 503 of thermal window 502 may be stamped or extruded on backplate 501 to form lower layer 902, thus creating stamped region or pocket 901. Injection point 903 in lower layer 902 allows plastic to be injected in stamped region 901, thus resulting in thermal window 502. Again, paint, coat, or finish layer 801 may overlay backplate 501 and thermal window 502 to provide a seamless visual appearance. As a result, in thermal window structure 900, metal remains under thermal window 502 in the form of lower layer 902 to facilitate equalizing surface of temperatures across backplate 501.

In some embodiments, systems and methods described herein may reduce an IHS housing's skin temperature by 4° C. or more. Additionally, or alternatively, these systems and methods may provide a 20% boost or greater in an IHS's thermal design power (TDP), which means the IHS can run cooler at higher TDPs (e.g., 3 W increase). Additionally, or alternatively, these systems and methods may facilitate the design of thinner IHS housings.

In many implementations, systems and methods described herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, wearable devices, IoT devices, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Reference is made herein to "configuring" a device or a device "configured to" perform some operation(s). It should be understood that this may include selecting predefined logic blocks and logically associating them. It may also include programming computer software-based logic of a retrofit control device, wiring discrete hardware components, or a combination of thereof. Such configured devices are physically designed to perform the specified operation(s).

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims

The invention claimed is:

1. An Information Handling System (IHS), comprising:
a plurality of components; and
a housing configured to hold the plurality of components, wherein the housing comprises a plate having a metal portion, a plastic portion, and a second plastic portion separated from the plastic portion by the metal portion, wherein the plastic portion and the second plastic portion are part of a honeycomb structure, and wherein the plastic portion is positioned adjacent a hot spot of the IHS.

2. The IHS of claim 1, wherein the housing has a tablet, smartphone, or laptop form factor.

3. The IHS of claim 1, wherein the plastic portion is at least partially co-extensive with the hot spot.

4. The IHS of claim 1, wherein a shape of the plastic portion follows a shape of the hot spot.

5. The IHS of claim 1, wherein the plastic portion is at least partially co-extensive with a heat pipe or heat sink of the IHS.

6. The IHS of claim 5, wherein a shape of the plastic portion follows a shape of the heat pipe or heat sink.

7. The IHS of claim 1, wherein the plastic portion is located between two fans of the IHS.

8. The IHS of claim 1, wherein the metal portion comprises at least one of:
magnesium, or aluminum.

9. The IHS of claim 1, wherein the plastic portion comprises a resin or polymer blend.

10. The IHS of claim 1, wherein the plastic portion is over molded onto the metal portion.

11. A backplate of a housing, comprising:
a first portion comprising a first material having a first thermal conductivity;
a second portion coupled to the first portion, wherein the second portion comprises a second material having a second thermal conductivity lower than the first thermal conductivity, and a third portion comprising the second material and separated from the second portion by the first portion, wherein the second and third portions are part of a honeycomb structure, and wherein at least one of the second or third portions is configured to be positioned next to a heat source of an Information Handling System (IHS) configured to operate in the housing.

12. The backplate of claim 11, wherein the first material comprises at least one of:
magnesium, or aluminum, and wherein the second material comprises a resin or polymer blend.

13. The backplate of claim 11, further comprising a third portion comprising a third material having a third thermal conductivity lower than the second thermal conductivity.

14. The backplate of claim 11, wherein the second portion is at least partially co-extensive with a perimeter of the heat source.

15. A method, comprising:
creating a thermal window on a plate of a housing configured to house an Information Handling System (IHS), wherein the thermal window corresponds to a processor area of the IHS, the thermal window further comprising: a first portion, a second portion, and a third portion separated from the second portion by the first portion, wherein the second and third portions are part of a honeycomb structure; and
integrating a material into the second and third portions thermal window, wherein a thermal insulation of the material is greater than a thermal insulation of the plate.

16. The method of claim 15, wherein creating the thermal window comprises removing a portion of the plate, and wherein integrating the material comprises injecting the material in the thermal window.

17. The method of claim 15, wherein creating the thermal window comprises stamping a portion of the plate, and wherein integrating the material comprises coating the stamped portion with the material.

18. The method of claim 15, wherein the thermal window is configured to equalize a temperature of the housing across the plate during operation of the IHS.

* * * * *

UNITED STATES PATENT AND TRADEMARK OFFICE
CERTIFICATE OF CORRECTION

PATENT NO. : 11,822,393 B2
APPLICATION NO. : 17/653736
DATED : November 21, 2023
INVENTOR(S) : Allen B. McKittrick, Pomin Shih and Jeffrey D. Kane Page 1 of 1

It is certified that error appears in the above-identified patent and that said Letters Patent is hereby corrected as shown below:

In the Claims

In Column 8, Lines 66 and 67, Claim 11, delete "configured to operate in the housing.".

In Column 10, Line 4, Claim 15, delete "thermal window, wherein a thermal insulation of the" and insert --wherein a thermal insulation of the-- therefor.

Signed and Sealed this
Twenty-sixth Day of December, 2023

Katherine Kelly Vidal
*Director of the United States Patent and Trademark Office*